United States Patent
Egbert et al.

(10) Patent No.: US 7,535,366 B2
(45) Date of Patent: May 19, 2009

(54) MICROWAVEABLE RADIO FREQUENCY IDENTIFICATION TAGS

(75) Inventors: William C. Egbert, Minneapolis, MN (US); Katherine A. Brown, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 357 days.

(21) Appl. No.: 11/610,243

(22) Filed: Dec. 13, 2006

(65) Prior Publication Data
US 2008/0143480 A1 Jun. 19, 2008

(51) Int. Cl.
*G08B 13/14* (2006.01)
(52) U.S. Cl. .................. 340/572.7; 340/572.8
(58) Field of Classification Search .............. 340/572.1, 340/572.7, 572.8, 10.1; 343/700 MS, 702, 343/741, 806, 846
See application file for complete search history.

(56) References Cited

U.S. PATENT DOCUMENTS

| | | | |
|---|---|---|---|
| 5,608,417 A | 3/1997 | de Vall | |
| 5,648,787 A * | 7/1997 | Ogot et al. | 343/826 |
| 6,031,505 A | 2/2000 | Qi et al. | |
| 6,094,177 A * | 7/2000 | Yamamoto | 343/806 |
| 6,329,915 B1 | 12/2001 | Brady et al. | |
| 6,476,766 B1 * | 11/2002 | Cohen | 343/700 MS |
| 6,861,993 B2 | 3/2005 | Waldner | |
| 6,892,545 B2 | 5/2005 | Ishikawa et al. | |
| 7,031,946 B1 | 4/2006 | Tamai et al. | |
| 7,060,953 B2 | 6/2006 | Ishikawa et al. | |
| 7,215,290 B2 * | 5/2007 | Cohen | 343/702 |
| 7,298,330 B2 * | 11/2007 | Forster et al. | 343/700 MS |
| 2006/0145869 A1 | 7/2006 | Appalucci et al. | |
| 2006/0250250 A1 * | 11/2006 | Youn | 340/572.7 |

FOREIGN PATENT DOCUMENTS

| | | |
|---|---|---|
| JP | 2001307055 | 11/2001 |
| JP | 2001317741 | 11/2001 |
| JP | 2004138331 | 5/2004 |
| JP | 2004-164055 | 6/2004 |
| JP | 2005242629 | 9/2005 |
| JP | 2006132793 | 5/2006 |

* cited by examiner

*Primary Examiner*—Van T. Trieu
(74) *Attorney, Agent, or Firm*—Peter L. Olson

(57) ABSTRACT

A radio frequency identification (RFID) tag that can survive exposure to microwave energy.

26 Claims, 7 Drawing Sheets

MICROWAVEABLE RADIO FREQUENCY IDENTIFICATION TAGS

TECHNICAL FIELD

The present invention relates to a radio frequency identification (RFID) tag that can survive exposure to microwave energy.

BACKGROUND OF THE INVENTION

Radio Frequency Identification (RFID) technology is becoming widely used in virtually every industry, including transportation, shipping, manufacturing, postal tracking, consumer goods, food, medical practice, airline baggage reconciliation, and highway toll management.

A typical RFID system includes a plurality of RFID tags or labels, at least one RFID reader or detection system having an antenna for communication with the RFID tags or labels, and a computing device to control the RFID reader. An RFID tag typically does not include a layer of adhesive. An RFID label typically is an RFID tag having a layer of adhesive for attaching the RFID tag to an item. RFID tags typically include an integrated circuit and an antenna, the combination of which are often referred commonly in the industry as an "RFID inlay." The RFID reader includes a transmitter that may provide energy or information to the tags or labels, and a receiver to receive identity and other information from the tags or labels. The computing device can process the information obtained by the RFID reader.

In general, the information received from an RFID tag or label is specific to the particular application, but often provides an identification for an article to which the tag is affixed. Exemplary articles include manufactured items, shipping containers, books, files, industrial, medical or forensic samples, animals, or virtually any other tangible article. Additional information may also be provided for the article. The tag or label may be used during a manufacturing process, for example, to indicate a paint color of an automobile chassis during manufacturing or other useful information.

The transmitter of the RFID reader outputs RF signals through the antenna to create an electromagnetic field that enables the tags or labels to return an RF signal carrying the information. The transmitter makes use of an amplifier to drive the antenna with a modulated output signal.

A conventional RFID tag or label may be an "active" tag or label that includes an internal power source, or a "passive" tag or label that is energized by the field created by the RFID reader antenna. Once energized, the tags and labels communicate using a pre-defined protocol, allowing the RFID reader to receive information from one or more tags or labels. The computing device serves as an information management system by receiving the information from the RFID reader and performing some action, such as updating a database. In addition, the computing device may serve as a mechanism for programming data into the tags or label via the transmitter A typical RFID system includes RFID tags or labels that are affixed to objects and an RFID reader that can read and optionally write unique identification information stored on the tag or label and provides generally automated, error-free identification of the objects. Often it is desirable to affix the RFID tag or label to the object permanently or at least for the duration of time that the object will be used and identified or for the lifetime of the object, so that errors due to removing the tag from the correct object and reattaching that tag to an incorrect object are generally eliminated. Additionally, it saves time and effort if RFID tags do not have to be removed and reattached to objects during the lifetime of the objects. Thus, it is desirable that the RFID tag or label remain functional (for example, able to receive and send information) for the time and under the various conditions that the object will be used and identified. Various situations or conditions during the lifetime of the RFID tag or label on the object may cause the RFID tag or label to become non-functional.

It is advantageous to use RFID tags and labels to identify a number of objects that will be exposed to microwave radiation during their lifetime of use. For example, RFID labels might be used to identify medical specimens, manufacturing samples, forensic samples or other laboratory samples that are processed with the aid of microwave energy in laboratory equipment. As another example, an RFID label might be used to identify a food product that will be heated in a home-use microwave oven. Japanese Patent Office Publications 2005-242629A and 2004-138331 disclose wireless integrated circuit (IC) tags on food container and cooking utensils for use in cooking appliances, such as microwave ovens. U.S. Pat. Nos. 7,031,946 and 6,892,545 disclose the use of RFID tags on food items that could go into a microwave oven. As another example, RFID tags or labels might be used to identify electronics components or devices or optical components or devices that are processed in manufacturing with microwave radiation. For example, curable materials may be cured in manufacturing with the aid of microwave radiation.

SUMMARY OF THE INVENTION

One aspect of the present invention provides a microwaveable radio frequency identification tag. In one embodiment of the microwaveable radio frequency identification tag, the tag comprises: a substrate including a first major surface and a second major surface opposite the first major surface; a first radio frequency identification antenna on the first major surface of the substrate, wherein the first radio frequency identification antenna fits within a shape of a polygon that has an area which is less than approximately the area of a circle with a diameter of one-twelfth (0.083) the wavelength of electromagnetic radiation generated by a microwave source, and wherein any linear dimensions of the polygon are less than approximately one-sixth (0.167) of the wavelength of the electromagnetic radiation generated by the microwave source.

Another aspect of the present invention provides an alternative microwaveable radio frequency identification tag. In one embodiment of the microwaveable radio frequency identification tag, the tag comprises a substrate including a first major surface and a second major surface opposite the first major surface; a first radio frequency identification antenna attached to the first major surface of the substrate; a low radio frequency-impedance element attached to the radio frequency identification antenna; wherein the first radio frequency identification antenna fits within a shape of a polygon that has an area which is less than approximately the area of a circle with a diameter of one-eighth (0.125) the wavelength of electromagnetic radiation generated by a microwave source, and wherein any linear dimensions of the first radio frequency identification antenna are less than approximately one-quarter (0.25) of the wavelength of the electromagnetic radiation generated by the microwave source.

BRIEF DESCRIPTION OF THE DRAWINGS

The present invention will be further explained with reference to the appended Figures, wherein like structure is referred to by like numerals throughout the several views, and wherein.

DETAILED DESCRIPTION OF THE INVENTION

Figure 1:
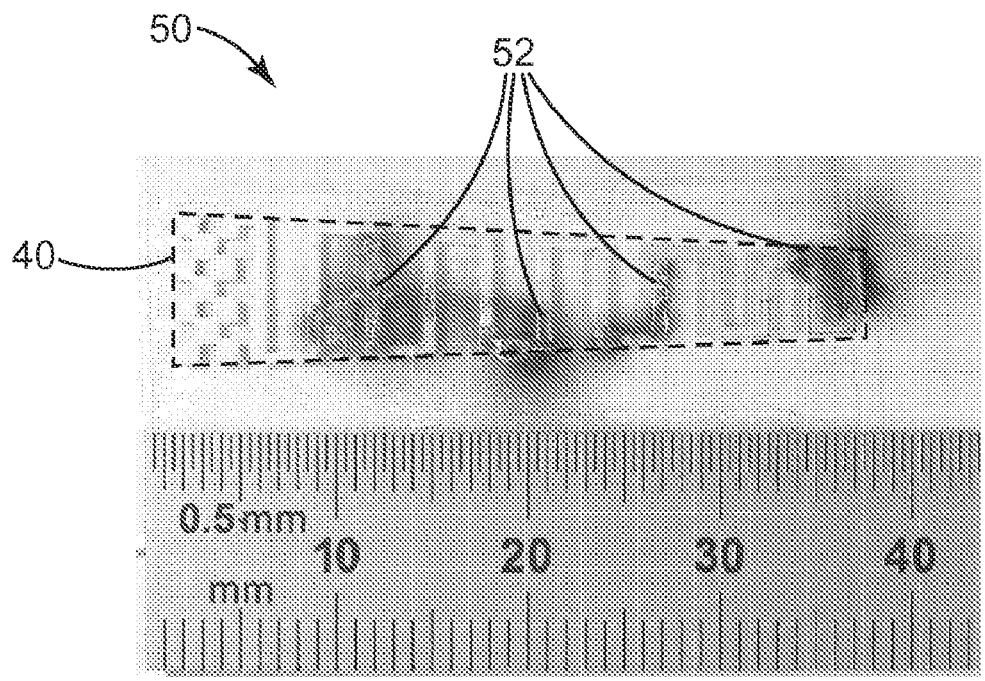
FIG. 1 is photomicrograph of one commercially available radio frequency identification antenna, after exposure to electromagnetic radiation generated by a microwave source.

Radio frequency identification ("RFID") tags and labels are increasingly being incorporated into or applied to food packaging, containers for cooking food, containers for samples that are produced and used in laboratories, industrial applications, medical application, forensics, and the like, and containers, holders, display devices such as frames or slides or other articles used in the processing of samples. These objects may be made of a wide variety of organic and inorganic materials including, but not limited to, glass, paper or paper products, plastics, or combinations thereof. These objects may contain a wide variety of substances or objects, for example, food items, beverages, tissue samples, production samples, soil samples, water quality samples, historical samples, and biological samples.

In these and other applications, an RFID tag or label may be exposed to microwave radiation during their use. For example, RFID labels might be used to identify medical specimens, manufacturing products, forensic samples or other laboratory samples that are processed with the aid of microwave energy in laboratory or production equipment. Microwave processing of samples, for example, tissue samples, may result in faster process times and improved quality. Typically, microwave energy is supplied as electromagnetic radiation at approximately 2.45 GHz frequency or at other frequencies in the range of about 2 to 14.5 GHz in commercial or experimental laboratory or production equipment. As another example, an RFID tag or label might be used to identify a food product that will be heated in a home-use microwave oven. Typically, commercial or home-use microwave ovens provide microwave energy as 2.45 GHz frequency electromagnetic radiation to heat foods and beverages. In either case, the RFID tag or label may be exposed to approximately 2.45 GHz frequency radiation at power levels ranging from 100 to 1200 watt, for times ranging from 1 second to many hours, with either continuous or pulsed microwave exposure. Often, home-use and laboratory microwave ovens may have controls that allow a user to select "full power" or fractions thereof, but they may achieve the lower power setting by using an on-off duty cycle, for example on 50% of the time, off 50% of the time for a 50% power setting. Other microwave ovens, usually those intended for laboratory use, may have controls that allow a user to select lower power settings that are achieved with continuous lower power, for example, a 1000-watt microwave oven may provide continuous 500-watt power when the user selects a 50% power setting.

However, exposing RFID tags or labels to electromagnetic radiation generated by a microwave source, such as a microwave oven, may cause the RFID tag or label to become non-functional. For example, some RFID antennas are designed to operate at 2.45 GHz, but usually only at low power levels, such as 1 to 5 watts emitted from an RFID reader, which is usually distributed over some area so that the RFID antenna receives only a portion of that power. But, such RFID tags will become non-functional if they are exposed to high microwave power levels, such as microwave power in the range of 100 to 1200 watts discussed above. In such cases, the electromagnetic energy in a microwave oven may cause the RFID tag or antenna elements to become very hot, possibly hot enough to burst into flame, creating a safety hazard that may be an even worse problem than the problem of a non-functional tag. The RFID tag may also arc to the microwave oven power supply or other electrical grounds in the oven, creating sparks and possibly damaging the power supply. U.S. Pat. No. 6,329,915 recognizes this problem; "the RF power density in the interior of a common microwave oven . . . is quite sufficient to fry a chip which has a resonant antenna." (See, column 5, lines 33-37.) In addition, the experiments below provide verification of such problems with commercially available RFID tags in microwave ovens. Furthermore, it has been discovered that some RFID tags designed to operate at various frequencies, for example, 13.56 MHz and 915 MHz, are susceptible to damage when they are exposed to high levels of microwave radiation. Even antenna structures that do not contain an integrated circuit may be damaged. Lastly, it is possible that the object to which the RFID tag is affixed may also be damaged.

As a result, there is a need to provide microwaveable RFID tags and labels that can survive exposure to electromagnetic radiation generated by a microwave source, such as a microwave oven. There is a further need to provide RFID tags and labels that can survive exposure in microwave ovens and meet certain application requirements after such exposure, such as read range by an RFID interrogator or reader. Lastly, there is a need to provide an RFID tag or label that preferably does not become overheated, burn or arc during exposure electromagnetic radiation generated by a microwave source, such as a microwave oven. The present invention provides RFID tags and labels that will survive exposure to electromagnetic radiation generated by a microwave source, such as a microwave oven and provide sufficient read range to meet typical RFID system requirements after such exposure. The antennas of the RFID tags and labels of the present invention are preferably designed to meet certain size parameters, as explained in more detail below.

Figure 2:
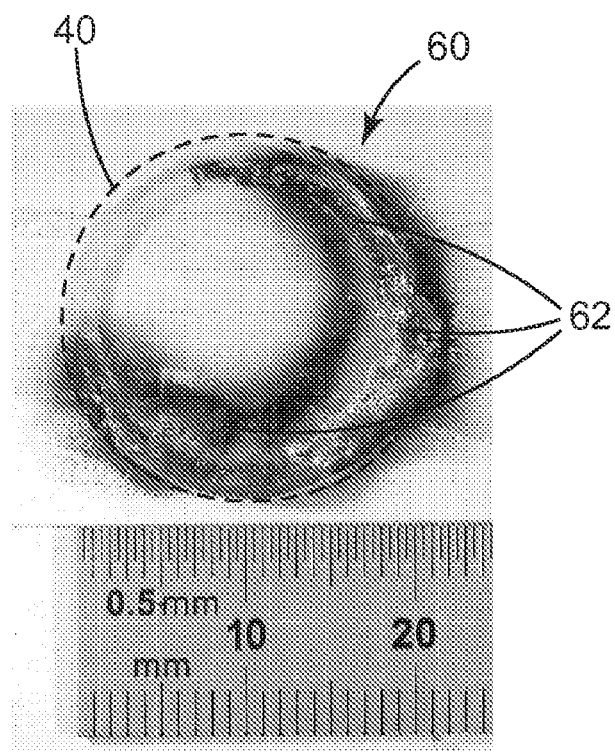
FIG. 2 is photomicrograph of another commercially available radio frequency identification tag, after exposure to electromagnetic radiation generated by a microwave source.
Figure 3:
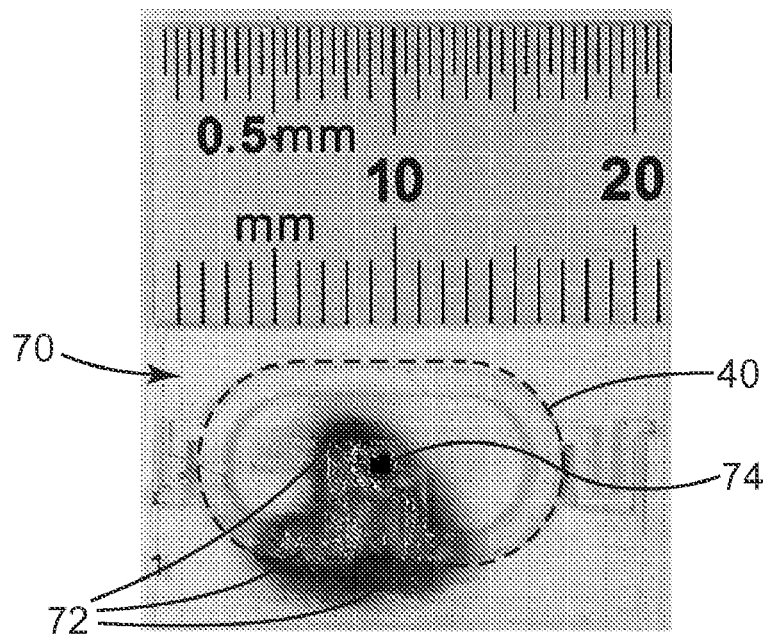
FIG. 3 is photomicrograph of yet another commercially available radio frequency identification tag, after exposure to electromagnetic radiation generated by a microwave source.

FIGS. 1-3 are photomicrographs of segments of commercially available RFID tags after exposure to electromagnetic radiation generated by a microwave source, in this case, a microwave oven. Specifics about each commercially available tag are included in the Example discussion below.

The inventors have discovered that if the antenna in the RFID tag meets certain design parameters relative to the wavelength of the microwave energy from the microwave source that the RFID tag experiences, then the likelihood that the RFID tag will survive the microwave energy and remain functional is significantly increased. Specifically, the outside dimensions of the metal circuitry comprising the RFID antenna should be very small compared to the wavelength of microwave energy in order to avoid damage during microwave exposure to the RFID antenna, integrated circuit, substrate or object to which the RFID tag is attached. To assist in comparing the relative size of the antenna, each photomicrograph in FIGS. 1-3 includes a polygon 40 that is shown in dotted lines, which has been sized to allow the RFID antenna to fit within. The polygon 40 is useful for calculating the area where the RFID antenna resides relative to the surface of the tag, and to compare that area to the area of a circle with a diameter that is some fraction of the wavelength of the electromagnetic radiation generated by the microwave source. The polygon is drawn relative to the surface of the substrate and is closely aligned with the outermost dimensions of the antenna. In one embodiment of the present invention, the area that represents the RFID antenna is preferably less than the area of the circle having a diameter that is one-twelfth (0.083) the wavelength of electromagnetic radiation generated by the microwave source, if the RFID tag is to survive exposure to the electromagnetic radiation generated by the microwave source. In addition, the linear dimensions of the polygon are such that the polygon will fit within a circumscribed circle of diameter preferably less than approximately one-sixth (0.167) of the wavelength of the electromagnetic radiation generated by the microwave source. In this embodiment, if both of these design parameters are met, then the likelihood of the antenna overheating, burning or arcing during exposure to electromagnetic radiation generated by the microwave source is significantly reduced, and the likelihood of the RFID tag being functional after such exposure, such as responding to or reading certain information from at minimum read ranges by an RFID interrogator or reader (otherwise known as a "successful" read), are significantly increased. For example, in one embodiment, for use in a 2.45 GHz microwave oven, the RFID antenna should fit within a circle of diameter of approximately 10 mm.

In another embodiment of the present invention, it is preferred that the RFID tag include a low radio frequency-impedance element, as discussed in more detail below. In this embodiment, the polygon area that represents the RFID antenna is preferably less than the area of a circle with a diameter of one-eighth (0.125) the wavelength of electromagnetic radiation generated by a microwave source, if the RFID tag is to survive exposure to the electromagnetic radiation generated by the microwave source. In addition, linear dimensions of the polygon are preferably less than approximately one-quarter (0.25) of the wavelength of the electromagnetic radiation generated by the microwave source. In this embodiment, if both of these design parameters are met, then the likelihood of the antenna overheating, burning, or arcing during exposure to electromagnetic radiation generated by the microwave source is significantly reduced, and the likelihood of the RFID tag being functional after such exposure, such as responding to or reading certain information from at minimum read ranges by an RFID interrogator or reader, are significantly increased. By low radio frequency-impedance, it is meant that the element has a low impedance at the frequency of the microwave power source.

FIGS. 1-3 show samples of commercially available RFID tags after exposure to electromagnetic radiation generated by a microwave source and such RFID tags include antennas that do not meet the design parameters outlined above, which are discussed in more detail in the Examples.

FIG. 1 shows a segment of a dipole RFID antenna 50 from a commercially available RFID tag with overheated or burned areas 52. During exposure in the microwave oven, there were at least four separate areas where the antenna became overheated enough to significantly damage the RFID antenna 50. The dipole antenna 50 includes meanders, which are typical in the art. The overall length of the dipole antenna is approximately 89.5 mm. If the dipole antenna were stretched out in a linear fashion, the length of the antenna, measured end to end, would be is approximately 36 mm. The maximum width of the dipole antenna is approximately an average of 6 mm. The polygon 40 is in the shape of a trapezoid. The RFID antenna did not meet the required design parameters discussed above.

FIG. 2 shows a commercially available RFID tag with a circle shaped antenna 60 with burned areas 62. During exposure in the microwave oven, the area around the integrated circuit became overheated and damaged and scorched most of the antenna, rendering it nonfunctional. This RFID tag also included an integrated circuit, located originally in the region of the antenna 60 above the "20" mark on the scale, but it was blown off during exposure to the electromagnetic radiation of the microwave oven. It appears that during exposure in the microwave oven, there was significant damage or overheating near the area around the integrated circuit and extending to significant portions of the antenna. The polygon 40 is a circle with a diameter of 19 mm. This RFID antenna did not meet the required design parameters discussed above.

FIG. 3 shows a commercially available RFID tag with an ellipse shaped antenna 70 with burned areas 72. During exposure in the microwave oven, the area around the integrated circuit 74 became overheated and damaged and portions of the antenna became overheated and damaged, scorching a large portion of the antenna. The polygon 40 is in the shape of an ellipse. The RFID antenna did not meet the required design parameters discussed above.

Figure 4:
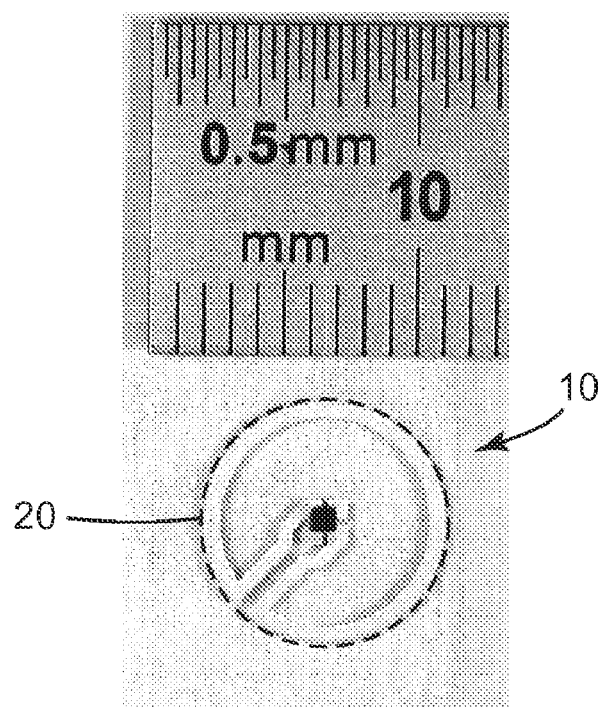
FIG. 4 is photomicrograph of one embodiment of the radio frequency identification tag of the present invention, after exposure to electromagnetic radiation generated by a microwave source.
Figure 5:
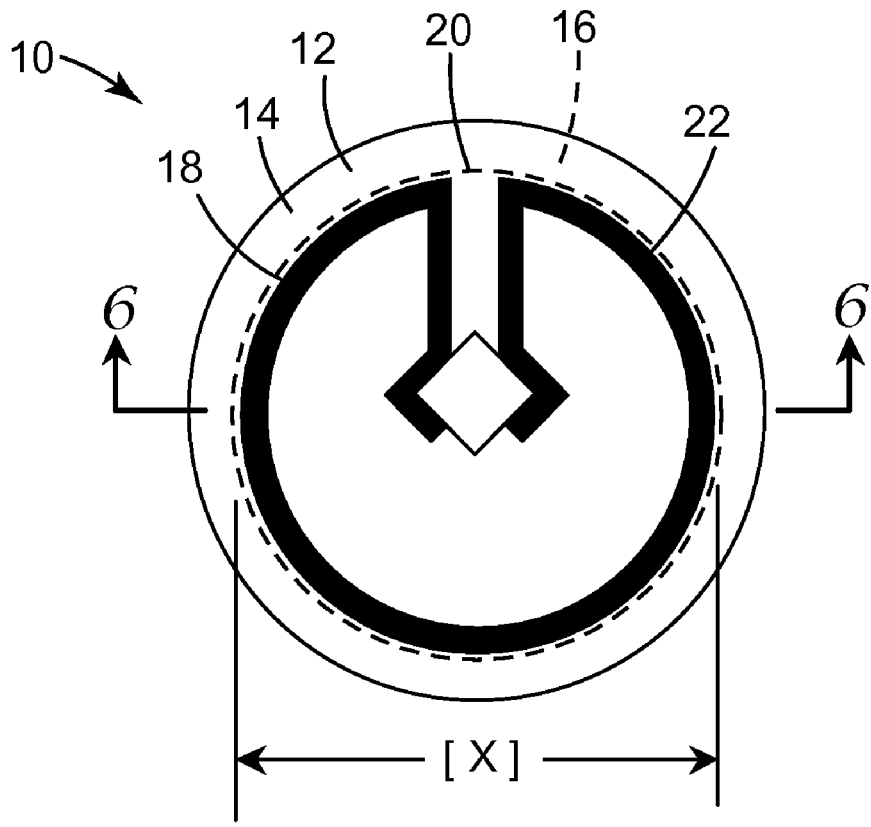
FIG. 5 is a top view of the radio frequency identification tag of FIG. 4.
Figure 6:
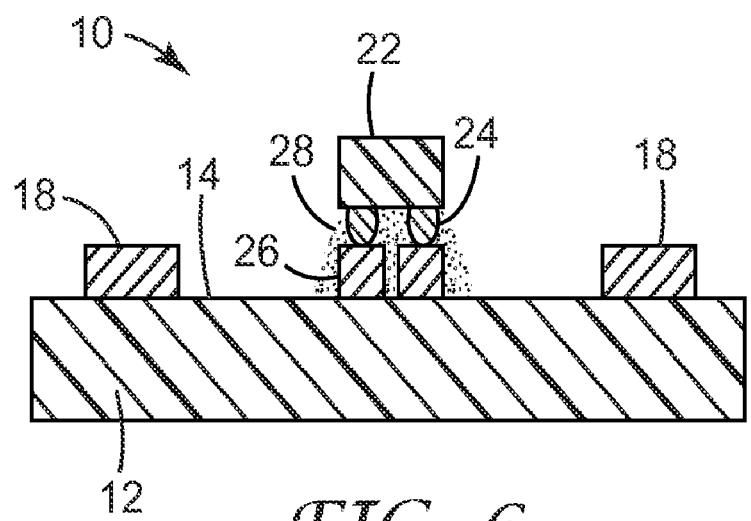
FIG. 6 is a cross-sectional view of the RFID tag in FIG. 5, taken along line 6-6.
Figure 7:
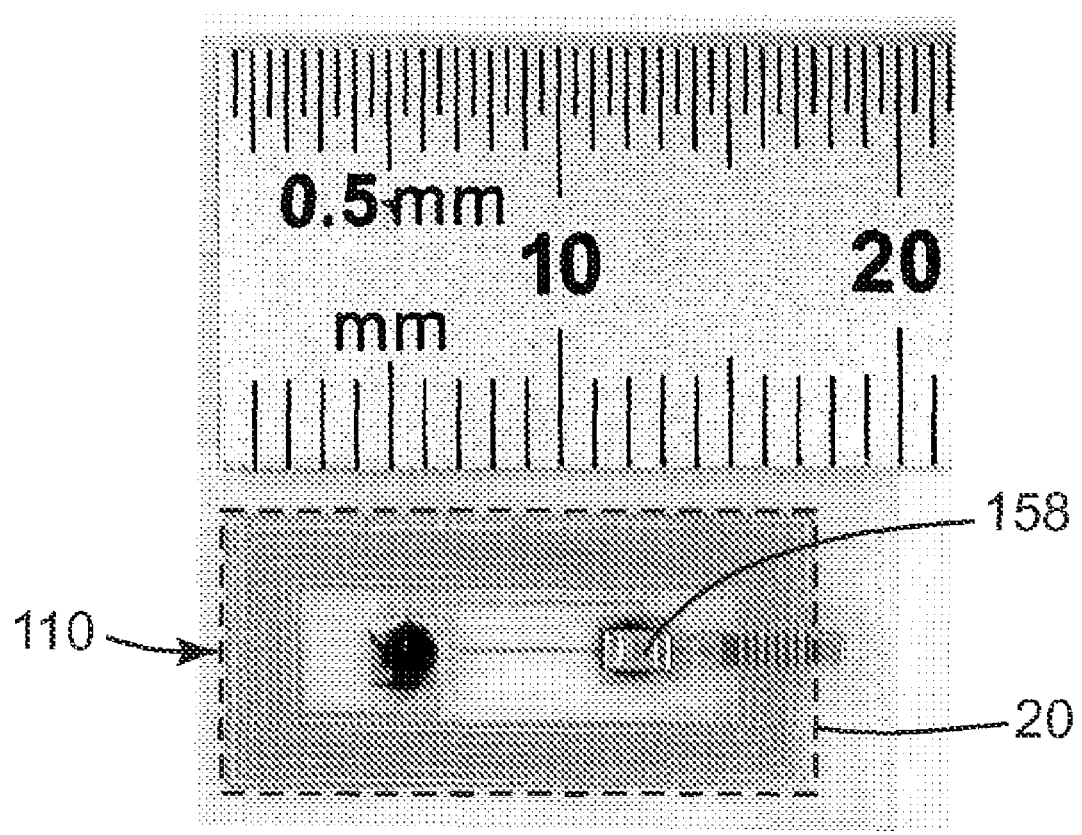
FIG. 7 is photomicrograph of another embodiment of the radio frequency identification tag of the present invention, after exposure to electromagnetic radiation generated by a microwave source.

FIGS. 4-13 illustrate various embodiments of microwaveable RFID tags of the present invention, and FIGS. 4 and 7 provide photomicrographs of embodiments of the RFID tag of the present invention, after exposure to electromagnetic radiation generated by a microwave source.

FIG. 4 shows one embodiment of the microwaveable RFID tag of the present invention, after exposure to electromagnetic radiation generated by a microwave source. The RFID antenna of this tag fits within a polygon 20, which is a circle having approximately the diameter of 10 mm. Note that the outside dimensions of the metal circuitry comprising the RFID antenna are very small compared to the antennas of the RFID tags shown in FIGS. 1-3, as represented by their respective polygons 20, 40. During exposure in the microwave oven, the RFID antenna, integrated circuit, substrate or object to which the RFID tag is attached did not experience any overheating or damage, and the RFID tag was functional after exposure to the microwave electromagnetic radiation.

FIGS. 5 and 6 illustrate drawings representing the microwaveable RFID tag shown in FIG. 4. RFID tag 10 includes a substrate 12 having a first major surface 14 and a second major surface 16 opposite the first major surface 14. RFID tag 10 also includes an antenna 18. The antenna 18 is generally in the shape of a circle. A polygon 20 illustrated in dotted lines surrounds or encloses the antenna 18 and closely resembles the outer linear dimensions of the antenna. "X" represents the diameter of the circle polygon 20. In one embodiment, for electromagnetic radiation of 2.45 GHz generated by a microwave source, the diameter of the circle 20 is approximately 10 mm.

Preferably, the RFID tag 10 also includes an integrated circuit 22, however it is not necessary. If an integrated circuit 22 is included, it is preferably impedance matched with the antenna as is well known by those skilled in the art. The integrated circuit 22 is electrically connected to the antenna 18 by integrated circuit attach pads 26 and conductive bumps 24.

RFID tag 10 preferably includes anisotropic conductive adhesive 28. However, the adhesive and electrical connections between the integrated circuit 22 to the integrated circuit attach pads 26 on the antenna 18 may be accomplished by anisotropic conductive paste, anisotropic conductive film, or nonconductive paste or film. Conductive pastes and films comprise an adhesive matrix containing metallic or metal-coated particles to assist the electrical connection between the conductive bumps or pads 24 on the integrated circuit 22 to the attach pads 26 on the antenna 18. The adhesive matrix may be a thermoplastic or thermoset adhesive. When nonconductive paste or film are used, the electrical connection between the conductive bumps or pads 24 on the integrated circuit 22 and the integrated circuit attach pads 26 may be made by direct physical contact between them, by a suitable solder that is compatible with both the bump and pad metallurgy, or by wire bonding between the integrated circuit pads 26 and the conductive bumps 24.

FIG. 7 is a photomicrograph of another embodiment of the RFID tag 110 of the present invention, after exposure to electromagnetic radiation generated by a microwave source. In this embodiment, the RFID tag 110 includes a low radio frequency-impedance element 158 attached to the radio frequency identification antenna. Preferably, the RFID tags of the present invention include low radio frequency-impedance elements when the antennas desired are larger in size compared to the antennas of the RFID tag illustrated in FIG. 4. The RFID antenna of this tag fits within a polygon 20, which is a rectangle having approximately the linear dimensions of 8 mm×17 mm. In one embodiment of the present invention, the polygon area that represents the RFID antenna is preferably less than the area of the circle having a diameter that is one-eighth (0.125) the wavelength of electromagnetic radiation generated by the microwave source, if the RFID tag is to survive exposure to the electromagnetic radiation generated by the microwave source. In addition, linear dimensions of the radio frequency identification antenna are less than approximately one-quarter (0.25) of the wavelength of the electromagnetic radiation generated by the microwave source. In this embodiment, if both of these design parameters are met, then the likelihood of the antenna overheating, burning or arcing during exposure to electromagnetic radiation generated by the microwave source is significantly reduced, and the likelihood of the RFID tag being functional after such exposure, such as responding to or reading from certain information at minimum read ranges by an RFID interrogator or reader are significantly increased.

For the example of a dipole antenna, when referring to any linear dimensions of the antenna being preferably less than approximately one-quarter (0.25) of the wavelength of the electromagnetic radiation generated by the microwave source, one other dimension must be considered. Dipole antennas are typically comprised of two or more linear elements that may be fully extended or that may be curved, bent or folded to fit within a certain area (such curves, bends or folds are often referred to as meanders.) The fully extended length of a dipole antenna preferable is less than about one quarter the wavelength of the microwave power source. By fully extended length, it is meant that the length if all curves, folds and bends are straightened out, or to put it another way, the length as measured along the path including the meanders.

During exposure in the microwave oven, the RFID antenna, integrated circuit, substrate or object to which the RFID tag 110 is attached did not experience any overheating or damage, and the RFID tag 110 was functional after exposure to the microwave electromagnetic radiation.

Figure 8:
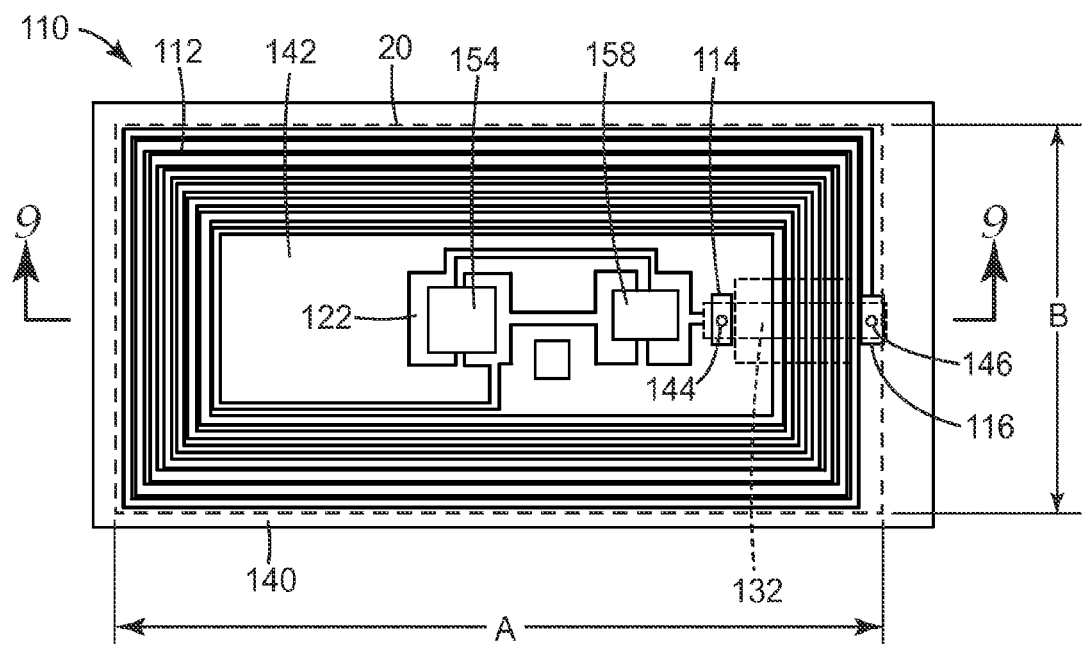
FIG. 8 is a top view of the radio frequency identification tag of FIG. 7.
Figure 9:
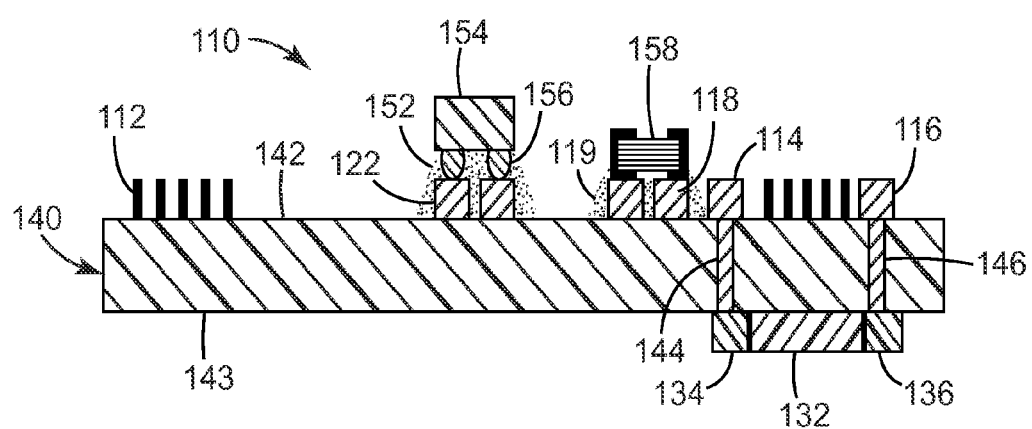
FIG. 9 is a cross sectional view of the radio frequency identification tag illustrated in FIG. 8, taken along line 9-9.

FIGS. 8 and 9 illustrate drawings representing the microwaveable RFID tag shown in FIG. 7. RFID tag 110 includes a substrate 140 having a first major surface 142 and a second major surface 143 opposite the first major surface 142. The RFID tag 110 includes an antenna 112 in the form of loops on the first major surface 142 of the substrate 140. The RFID tag 110 includes through-hole vias 144, 146 through which the ends of the loop antenna are electrically connected by drilling and plating the through-hole vias 144, 146 and through use of through-hold via landing pads 114, 116 on the first major surface 142 of the substrate 140, through-hold via landing pads 134, 136 and the bridge 132, both on the second surface 143 of the substrate 140.

The RFID tag 110 also includes an integrated circuit 154, which is electrically connected to the antenna 112 by integrated circuit attach pads 122 and conductive bumps 156. RFID tag 110 preferably includes anisotropic conductive adhesive 152. However, the adhesive and electrical connections between the integrated circuit 154 to the integrated attach pads 122 on the antenna 112 may be accomplished by other methods, as described in reference to FIGS. 5 and 6. RFID tag 110 also preferably includes a low radio frequency-impedance element 158 attached to the RFID antenna 112. In this embodiment the low radio frequency-impedance element is a capacitor 158. The capacitor is shown as an Surface Mount Technology (SMT) package. Capacitor 158 is electrically attached to the antenna 112 through capacitor mounting pads 118 and anisotropic conductive adhesive 119.

Similar to FIG. 7, the RFID antenna 112 is configured to fit within a polygon 20 which has an area, that is preferably less than the area of the circle having a diameter that is one-eighth (0.125) the wavelength of electromagnetic radiation generated by the microwave source, to provide an RFID tag that survives exposure to the electromagnetic radiation generated by the microwave source. In this case, the polygon is in the shape of a rectangle with the dimensions of length "A" and width "B." In addition, linear dimensions of the radio frequency identification antenna, A and B, are less than approximately one-quarter (0.25) of the wavelength of the electromagnetic radiation generated by the microwave source.

Figure 10:
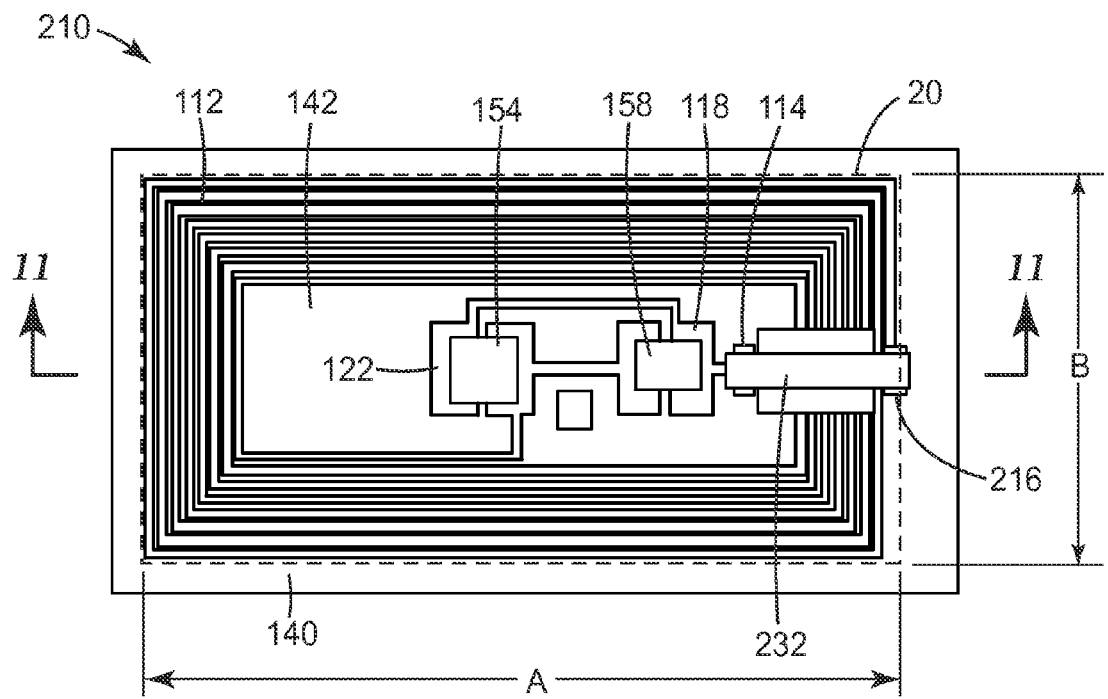
FIG. 10 is a top view of another embodiment of the radio frequency identification tag of the present invention.
Figure 11:
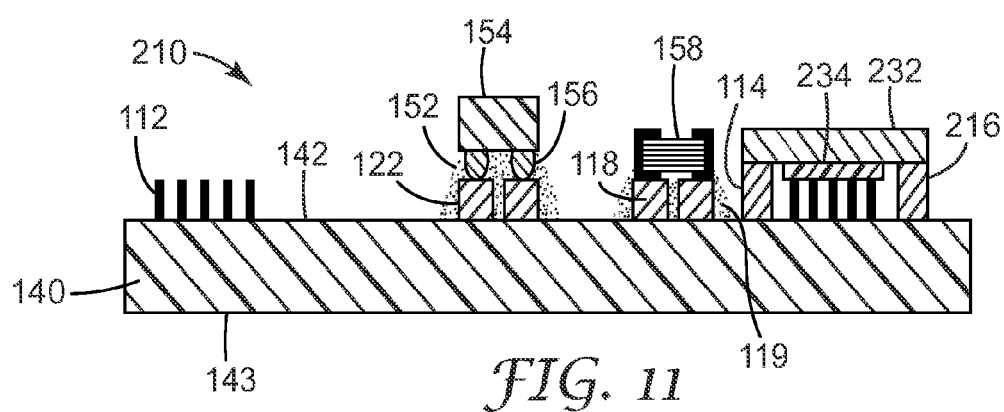
FIG. 11 is a cross sectional view of the radio frequency identification tag illustrated in FIG. 10, taken along line 11-11.

Another embodiment of the microwaveable RFID tag of the present invention is illustrated in FIGS. 10 and 11. RFID tag 210 is essentially the same design as RFID tag 110 illustrated in FIGS. 8 and 9, except that the interior and exterior ends of the loop antenna 112 are electrically connected by a bridge 232 on the first surface 142 of the substrate instead of the second surface 143. As a result, there is no need for through-hole vias. The bridge 232 is insulated from the antenna 112 by an insulated layer 234 and held in place by adhesive layer 236 (not shown). Preferably, the RFID antenna 112 is configured to fit within the polygon 20 which has an area, that is preferably less than the area of the circle having a diameter that is one-eighth (0.125) the wavelength of electromagnetic radiation generated by the microwave source, to provide an RFID tag that survives exposure to the electromagnetic radiation generated by the microwave source, and the linear dimensions of the radio frequency identification antenna, A and B, are less than approximately one-quarter (0.25) of the wavelength of the electromagnetic radiation generated by the microwave source.

Figure 12:
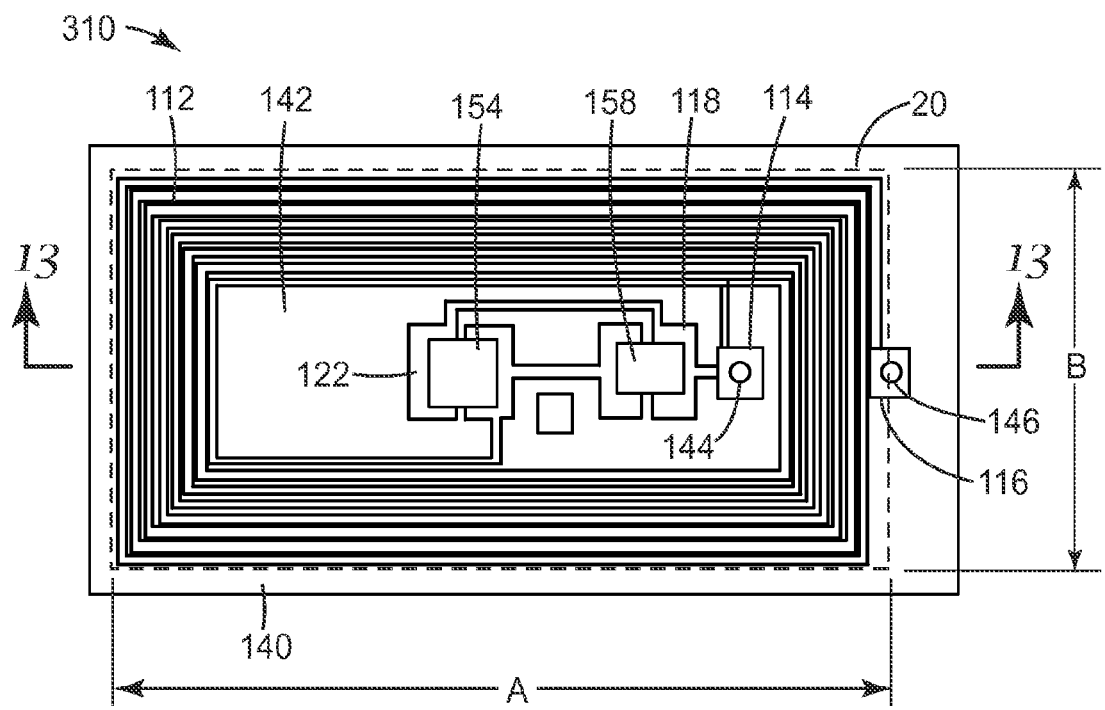
FIG. 12 is a top view of another embodiment of the radio frequency identification tag of the present invention.
Figure 13:
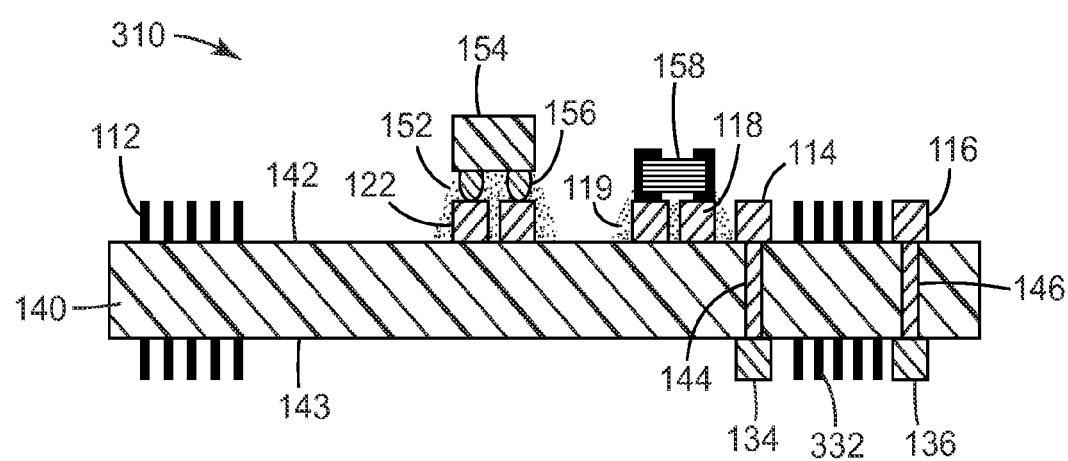
FIG. 13 is a cross sectional view of the radio frequency identification tag illustrated in FIG. 12, taken along line 13-13.

Yet another embodiment of the microwaveable RFID tag of the present invention is illustrated in FIGS. 12 and 13. RFID tag 310 is essentially the same design as RFID tag 110 illustrated in FIGS. 8 and 9, except that it includes a second antenna 332 on the second major surface 143 of the substrate 140. The second antenna 332 is a loop antenna. The first antenna 112 is connected to the second antenna 332 by drilling and plating through-hole vias, both inner 134 and outer 136. In this context, "inner" refers to features interior to the antenna loops, and "outer" refers to features that lie outside the outermost boundary of the antenna loops. Similar to other embodiments, the antenna 112 is configured to fit within the polygon 20 which has an area, that is preferably less than the area of the circle having a diameter that is one-eighth (0.125) the wavelength of electromagnetic radiation generated by the microwave source, to provide an RFID tag that survives exposure to the electromagnetic radiation generated by the microwave source, and the linear dimensions of the radio frequency identification antenna, A and B, are less than approximately one-quarter (0.25) of the wavelength of the electromagnetic radiation generated by the microwave source.

In the embodiment illustrated in FIGS. 12 and 13, the antenna 332 is designed to preferably fit within the same area represented by polygon 20, even if the antennas 112, 332 are not perfectly aligned relative to each other. This design ensures that the magnetic induction produced by the circulation current in each of the segments of the antenna is additive. Starting at the inner via landing pad 114, a current will travel through the integrated circuit 154, then clockwise through the first antenna loops 112 to outer via landing pad 116. At this point, the current passes through the outer through-hole via 146 to the antenna loops 332 on the second surface 143. The current continues to circulate clockwise, as viewed through the substrate 140 from above the first surface in FIG. 12, following the antenna 332 from the outer via landing pad 136 clockwise through the antenna to the inner via landing pad 134 on the second surface 143. At this point, the electrical current passes from the second surface through the inner through-hole via 134 back to the first surface through the via landing pad 114.

Preferably, the substrate 12,140 is a flexible substrate. The flexible substrate may be polyester terephthalate (PET), polyimide, polyethylene, epoxy or reinforced epoxy, or similar materials.

The RFID integrated circuit 22, 154 may be any of several commercially available integrated circuits, such as those available from Texas Instruments based in Dallas, Tex. Common low capacitance RFID high frequency integrated circuits have input capacitance ranging from 10 pF to 30 pF, typically around 23.5 pF. "High capacitance" RFID integrated circuits have input capacitances ranging from 70 pF to 95 pF, depending on the manufacturer's design. The RFID integrated circuit may also be any of several readily available RFID ultra high frequency integrated circuits, which generally have input capacitances in the range of 0.1 pF to 1.1 pF depending on the manufacturer's design.

It may be desirable to maximize the read range of the RFID tags 10, 110, 210, 310. The read range of the RFID tags is related to the size of the RFID antenna, and generally larger antennas correspond to larger read ranges. Preferred read ranges are at least 2 mm.

However, it may be desirable to maximize the RFID tag read range to a range that requires an outside dimension for the antenna that is larger than one-twelfth the wavelength of the microwave energy. Therefore, the RFID tags with antennas with an outer dimension in the range of one-twelfth to about one-sixth the wavelength of the microwave energy preferably also include a low radio frequency-impedance bypass element 158. The low radio frequency-impedance bypass element 158 may be, for example, a capacitor that may be built into the antenna circuitry, a capacitor that is supplied as a discrete component that is attached to the antenna, a capacitor that is built into the RFID integrated circuit (also known as an RFID chip), and the like. Capacitors in the range of about 20 to 90 pF may be suitable. Other low radio frequency-impedance bypass element 158 include a high dielectric material waveguide-like component, that is a material with a high DC resistance (low DC conductivity) but low impedance at the frequency of microwave exposure. The low radio frequency-impedance bypass element 158 shields the RFID integrated circuit from at least a portion of the current it would otherwise experience.

The RFID tags 10, 110, 210, 310 may be designed to communicate with an RFID reader at 13.56 MHz (so-called "high frequency" or "HF"), 915 MHz (so-called "ultra high frequency" or "UHF," which generally also refers to frequencies including 868 MHz to 958 MHz) or any of a number of other frequencies, for example, frequencies allowed by regulatory agencies such as the Federal Communications Commission in the United States of America (and other similar agencies in other countries).

In alternative embodiments, the design parameters discussed above relative to the antennas 18, 112 may also be used to design an antenna that may be used with other types of integrated circuits (chips) or with other types of solid-state devices (such as light emitting diodes, LEDs), with sensor devices, and the like, in any combination with or without an RFID integrated circuit. For example, an antenna that contains no integrated circuits or other devices at all, i.e., a bare antenna, that meets the antenna design parameters of this invention, is within the scope of this invention. Such a bare antenna may be useful as a security device, for example and electronic article surveillance (EAS) device. In another example, an RFID integrated circuit and an LED may be combined in an inlay with an antenna that meets the antenna design parameters of this invention, and this construction would be within the scope of this invention.

Optionally the capacitor 158 that is a commercially available surface mount technology capacitor or a capacitor 158 that is built into the antenna circuitry may be used to tune the inlay resonant frequency. The detuning effects of various substrates, such as paper, glass, or plastic, can be compensated by choice of the tuning capacitor so that the read range and read rate are optimized for the conditions of the particular application.

Antennas for the microwaveable RFD tags of the present invention may have general outer shapes that are circles, ovals, squares, rectangles, trapezoids, pentagons, hexagons, octagons, or any other regular or irregular shape. It may be preferable to avoid angles that are less than about 90 degrees in the outer shape, for example, it may be preferable to avoid an antenna that is a triangle, because sharper points associated with angles of less than about 90 degrees may be more likely to radiate energy and lead to arcing. Additionally, a design including angles of less than about 90 degrees and meeting the other requirements of the present invention may have a shorter read range than could be achieved with a design including only angles of 90 degrees or more; for example, an antenna that is the largest isosceles triangle that will fit inside a circle of diameter 10 mm may have a shorter read range than an antenna that is the largest square that will fit inside a circle of diameter 10 mm. Antennas may optionally be coils with one or more than one turn (up to a practical limit imposed by the width of the coils that can be achieved an arranged within the size limits of the design parameters.)

Antennas for the microwaveable RFD tags of the present invention may optionally include various other design elements as are known to those skilled in the art, for example, tuning elements and impedance matching elements. These design elements may, for example, include tuning stubs, capacitors, variable feed points, ground planes, and additional coils.

It may be desirable to adjust the form factor of the RFID antenna so that an RFID label or tag will fit on a particular object. For example, the area that is available for a label might be only 10 mm by 15 mm. Antennas that are a circle that is 1 cm in diameter, an oval that is 10 mm by 15 mm and contains a low RF impedance bypass component, or a rectangle with sides of 10 and 15 cm that contains a low RF impedance bypass component will fit within the area and meet the requirements of the microwaveable RFID tags of the present invention.

Materials chosen for RFID tags of the present invention may be selected from a range of materials, with the choice being dependent on manufacturing cost, manufacturing yield, tag performance in its intended use, environmental factors (in addition to microwave radiation exposure), and similar considerations.

Antennas 18, 112 and other conductive circuit elements may be patterned thick or thin films of copper, aluminum, silver, gold, other metals, or carbon. The antennas may also be printed in conductive inks comprising dispersions of silver, gold, or other metals, or particles coated with silver, gold or other metallic conductors, or nonmetallic conductors such as carbon or polyaniline. The antennas can be manufactured using commercially available flexible circuits that are produced using processes and designs of proven high yield. In general, the higher the conductivity of the antenna, the greater the current that will be produced in a coil of a particular size during microwave exposure. In general, the higher the conductivity of the antenna, the greater the read range of the RFID tag for a coil of a particular size.

As mentioned above for the second design parameter, a capacitor of about 20 to 90 pF may be employed and may be supplied fully or partially by a capacitor incorporated into the RFID integrated circuit. Alternatively, the additional capacitor may be configured as a surface mount technology (SMT) device in any of a number of standard package outlines that are readily available from electronics components suppliers. Alternatively, the additional capacitor may be configured as a small silicon die with attach pads or bumps that are similar in form and function to the bumps or pads on the RFID silicon die. The connection points to the capacitor may be in the form of metal caps on the ends of the SMT package, or as pads or bumps in the silicon die version. In either case, the adhesive and electrical connection of the capacitor to the conductive circuit may use one of the methods mentioned above. The technical solution chosen for the capacitor connection need not be the same as the technology chosen for the RFID die attach process.

The RFID tags of the present invention may include a layer of adhesive attached to the one of the major surfaces 14, 16, 142, 143 of the substrate 12, 140 to create an RFID label. The layer of adhesive is useful for attaching the RFID labels to objects. The RFID label may also optionally include a liner on the layer of adhesive. Suitable liner materials include polyethylene and silicon coated papers.

The RFID tags of the present invention may optionally include a cover layer. The cover layer may be directly attached to the substrate 12, 140 for example, by lamination. Alternatively, the cover layer may be attached to the substrate 12, 140 by a layer of adhesive. The adhesive can be the same as or different than the layer of adhesive mentioned in the above paragraph. The cover layer and layer of adhesive are useful for attaching the RFID tags to an article. The cover layer may extend beyond the substrate 12, 140, for example, it might be a tape that is used to affix the RFID tag to an object. Suitable materials for the cover layer include polyester films or papers. Alternatively, for example, the cover layer and layer of adhesive may be any commercially available tape or film sold by 3M Company, based in St. Paul, Minn. The cover layer may be printed or patterned with information, for example, a company logo, an advertisement, or information about the object to which the label 10 is attached. The printed information may specifically include a bar code or other symbolic representation to allow a visual or optical confirmation of the information pertaining to the RFID tag. Alternatively, the cover layer may be stapled or otherwise attached to any item. The cover layer may be wrapped around a handle of a container, for example, and then attached to itself to attach the RFID tag to the container.

The RFID tags of the present invention may optionally be molded into or incorporated in various objects, containers, or housings, or the like.

The operation of the present invention will be further described with regard to the following detailed examples. These examples are offered to further illustrate the various specific and preferred embodiments and techniques. It should be understood, however, that many variations and modifications may be made while remaining within the scope of the present invention.

EXAMPLES

All RFID tag samples were prepared and subjected to microwave electromagnetic radiation as follows.

RFID tag samples were individually attached to glass microscope slides with adhesive transfer tape, 3M Type 924, available from 3M Company, St. Paul, Minn. The microscope slides were 25 mm×75 mm and were 1 mm thick. The microscope slides supporting the tags were placed in a plastic microscope slide holder tray, with outside dimensions of 88 mm×140 mm. The microscope slide holder had 25 slotted positions to support microscope slides. The microscope slides, with the attached RFID tags, were positioned in the microscope slide holder with the 25 mm axis of the slide vertical. The microscope slides with attached sample RFID tags were evenly spaced along the 140 mm length of the microscope slide holder, according to the number of samples evaluated in a specific test.

Each RFID tag sample type was exposed to the electromagnetic radiation in a microwave oven with the same type of tag. No RFID tags were tested concurrently with dissimilar design types.

The microscope slide holder containing samples (all of a type of RFID tag) was placed on the center turntable of the microwave oven.

In addition to the RFID samples in the microscope slide holder, a container with approximately 200 milliliters (ml) water (starting temperature approximately 8 degrees C.) was put into the microwave chamber. The water container was placed in the left rear quadrant of the microwave oven in a non-rotating position, i.e. the water container was not placed on the microwave oven turntable. The water provided a load to absorb some of the microwave energy and to simulate the actual conditions of use in which the RFID tags or labels would be applied to microwave-absorbent objects or samples.

The microwave oven used, a commercially available unit, was a General Electric Model JES831WF001, 2450 MHz (wavelength 122 mm), 1.2 kW, microwave oven available from General Electric Co., Louisville, Ky. 40225. The oven was operated at full power for three timed intervals: two minutes, four minutes, and eight minutes for each sample set.

If severe arcing to, or burning of, one or more samples in a sample set was observed during the test, the oven was shut down immediately to prevent electrical damage to the oven, and any timed interval tests for such sample set not yet conducted at the time of severe arcing to, or burning of, one or more samples in the sample set, were not conducted.

Example 1

Twelve UHF (ultra high frequency) RFID tags, shown in FIG. 4, comprised of a printed silver ink circular loop antenna of 9 mm diameter (model RSI-126, available from RSI ID Technologies, Chula Vista, Calif.) with a silicon integrated chip (model Impinj Monza2, available from Impinj, Inc., Seattle, Wash.) attached to the antenna were subjected to microwave electromagnetic radiation as described above.

The microwave exposure test was conducted on two different sets of samples, with six samples per set. Both sets of RFID tags with 9 mm circle antennas went through the full two minute, four minute, and eight minute microwave electromagnetic radiation exposure cycle. In each of the microwave exposure tests, the RFID tags with 9 mm circle antennas did not create arcs, nor did they overheat or burn.

The area of a polygon representing the outer shape of the 9 mm diameter circle antenna, the value of the wavelength of the electromagnetic radiation to which the inlays were exposed, an area of a circle with diameter equal to one-twelfth of the wavelength of the electromagnetic radiation and the value of a dimension equal to one-sixth of the wavelength of the electromagnetic radiation are presented in the following table.

| Area of 9 mm Diameter Antennas (Polygon) | Wavelength of 2450 MHz Microwave Radiation | Area of Circle with Diameter equal to ¹/₁₂ of Wavelength | Value of Dimension equal to ⅙ of Wavelength |
| --- | --- | --- | --- |
| 63.6 mm² | 122 mm | 80.11 mm² | 20.3 mm |

Example 2

Ten samples of Hitachi (Hitachi Co., Fair Lawn, N.J.) Maxell "coil-on-chip" RFID tags were tested as described below in Table 1. These products consist of a contactless RFID integrated circuit with an antenna coil added as the top layer of the multi-layer circuit semiconductor construction. The multi-layer circuit construction is 2.5 mm×2.5 mm. Each chip was placed on the glass microscope slide with the coil in contact with the glass, except for Sample 4 where the chip was placed so that the antenna coil was in contact with the tape, and Sample 10 which was placed in a plastic bottle cap instead of on a glass slide and held in place with the above described transfer tape.

The "Coil-on-Chip" RFID tags were exposed to microwave radiation as described above, but with the following differences. The microwave oven was operated at the power settings listed in Table 1 and for the exposure time period listed. (A Power setting of 50% means that the microwave oven operated at full power for 50% of the time and was off for 50% of the time.) Each sample was irradiated separately, except for Samples 8, 9 and 10, which were all placed in the microwave oven at the same time. For Samples 7, 8, 9 and 10, four containers of 300 ml of water each were placed into the four non-rotating quadrants of the microwave oven.

During exposure, there were no visible signs of arcing, overheating, or burning. After exposure, each RFID tags was tested with an RFID reader and found to be fully functional. There were no signs of heating or damage to any of the objects to which the tags had been attached, i.e., the microscope slides, the tape or the plastic bottle cap.

TABLE 1

| | | Microwave Exposure | | |
| --- | --- | --- | --- | --- |
| Sample | Power | Exposure (minutes) | Containers Water | Post-exposure test |
| 1 | 100% | 1 | 1 | functional |
| 2 | 100% | 1 | 1 | functional |
| 3 | 100% | 1 | 1 | functional |
| 4 | 100% | 2 | 1 | functional |
| 5 | 50% | 2 | 1 | functional |
| 6 | 50% | 4 | 1 | functional |
| 7 | 100% | 6:53 | 4 | functional |
| 8 | 100% | 8 | 4 | functional |
| 9 | 100% | 8 | 4 | functional |
| 10 | 100% | 8 | 4 | functional |

The area of the Hitachi Maxell "coil-on-chip" RFID tags, the value of the wavelength of the electromagnetic radiation to which the inlays were exposed, an area of a circle with diameter equal to one-twelfth of the wavelength of the electromagnetic radiation and the value of a dimension equal to one-sixth of the wavelength of the electromagnetic radiation are presented in the following table.

| Area of Hitachi "coil-on-chip" Antennas (Polygon) | Wavelength of 2450 MHz Microwave Radiation | Area of Circle with Diameter equal to ¹/₁₂ of Wavelength | Value of Dimension equal to ⅙ of Wavelength |
| --- | --- | --- | --- |
| 6.25 mm² | 122 mm | 80.11 mm² | 20.3 mm |

Example 3

HF (high frequency) RFID tags, as shown in FIG. 7, were fabricated by Multek of Northfield, Minn. as follows. An eight turn single-sided loop antenna with nominal dimensions of the outermost antenna loop of 8 mm by 17 mm was fabricated on a two-sided copper on polyester terephthalate (PET) flexible substrate. The antenna loops, through-hole via landing pads, capacitor mounting pads, and integrated circuit attach pads were copper circuit elements on the first surface, with the circuit on the second surface comprising a bridge and the through-hole via landing pads. Connection from the first surface to the second surface was made by drilled and plated through-hole vias. The attributes of the above described antenna are: 160 □m line width, 130 □m line spacing, and 460 □m drilled and plated through-hole vias. The inductance of the eight turn antenna in this format was approximately $1.06 \times 10^{-6}$ Henries (1.06 □H).

To five of the above described HF RFID tags, an ISO SLI integrated chip conforming to the ISO-15693 RFID format, from NXP Semiconductors, San Jose, Calif., was attached to the integrated circuit attach pads using Henkel Loctite 3447 Anisotropic Conductive Paste adhesive available from Henkel Corporation, Los Angeles, Calif. The circuit resonant frequency ($f_{RES}$) of the above described HF antenna with silicon integrated circuit was calculated to be 31.9 MHz, well above the designated 13.56 MHz operating frequency for HF RFID systems. By adding a 100 pF capacitor (Kemet C0402C101J3GAC-TU, available from Newark InOne, Chicago, Ill.) to the RFID tag, the resonant frequency was shifted down to $f_{RES}$=13.9 MHz, very nearly equal to the desired 13.56 MHz value for HF RFID systems. The capacitor was connected to the capacitor pads by reflowed eutectic tin-lead (Sn—Pb) solder.

The finished RFID tags were then mounted on glass microscope slides as described above, with the additional step that a cover of 3M Type 850 clear polyester adhesive tape, available from 3M Co, St. Paul, Minn., was applied over each RFID tag.

The slide-mounted RFID tags were tested for read range on a 3M Reader Pad using a 3M Reader, available from 3M Company, St. Paul, Minn., operating at 1.0 watt output power. At the center of the antenna loop with the center of the antenna loop positioned at the center of the Reader Pad, with the reader antenna and tag antenna thus coaxially aligned, i.e. the planes of the antennas were parallel, the read range of the RFID inlays on the microscope slide ranged from 28 mm to 72 mm above the surface of the 3M Reader Pad.

The five RFID tags were placed into a microscope slide holder with an approximate 10 mm separation between them. An additional five antennas with capacitor, but without an RFID integrated circuit, constructed as above described, were similarly mounted on microscope slides. These additional slides were inserted into the slide holder interspersed between the slides with RFID tags containing an RFID integrated circuit.

The slide holder containing the ten samples were exposed to microwave radiation as described above, but with the following difference. The microwave oven was run on high power for a single timed interval of eight minutes. No observable adverse effects to the RFID tags or oven, such as arcing, overheating, sparking or burning of the RFID tags were observed.

After the five RFID tags were removed from the microwave oven, their continued operability or functionality was confirmed by reading each RFID with the 3M Reader Pad and 3M Reader. The read range after microwave exposure was in each case similar to the read range before the microwave exposure.

The area of a polygon representing the shape of the 8 mm by 17 mm antennas, the value of the wavelength of the electromagnetic radiation to which the inlays were exposed, an area of a circle with diameter equal to one-eighth of the wavelength of the electromagnetic radiation and the value of a dimension equal to one-quarter of the wavelength of the electromagnetic radiation are presented in the following table.

| Area of 8 mm by 17 mm Antennas (Polygon) | Wavelength of 2450 MHz Microwave Radiation | Area of Circle with Diameter equal to ⅛ of Wavelength | Value of Dimension equal to ¼ of Wavelength |
| --- | --- | --- | --- |
| 136 mm² | 122 mm | 182.65 mm² | 30.5 mm |

Comparative Example 1

A set of three elliptical loop inlays was cut out from the central portion of a three larger antenna (RSI-611, available from RSI ID Technologies, Chula Vista, Calif.). The elliptical loop inlays comprised the printed silver antenna with a silicon die (Impinj Monza2 available from Impinj, Inc., Seattle, Wash.). The dimensions of the resultant inlay was 19 mm by 7 mm.

The three ellipse inlays were prepared and mounted to microscope slides and tested in a microwave oven as above described. The microwave electromagnetic radiation exposure test on the set of ellipse inlays was halted after approximately 15 seconds because the antenna at the end of the slide holder began to arc and burn. The residual damage caused by the microwave electromagnetic field to the ellipse antenna is shown in FIG. 3.

The area of a polygon representing the outer shape of the 19 mm by 7 mm inlays, the value of the wavelength of the electromagnetic radiation to which the inlays were exposed, an area of a circle with diameter equal to one-twelfth of the wavelength of the electromagnetic radiation and the value of a dimension equal to one-sixth of the wavelength of the electromagnetic radiation are presented in the following table.

| Area of 19 mm By 7 mm Antennas (Polygon) | Wavelength of 2450 MHz Microwave Radiation | Area of Circle with Diameter equal to 1/12 of Wavelength | Value of Dimension equal to ⅙ of Wavelength |
| --- | --- | --- | --- |
| 133 mm² | 122 mm | 80.11 mm² | 20.3 mm |

Comparative Example 2

Three RFID tags with 19 mm diameter circle antennas were cut out from the central portion of a larger antenna (RSI-128, available from RSI ID Technologies, Chula Vista, Calif.). The 19 mm circle inlays comprised the printed silver antenna with a integrated circuit (Impinj Monza2).

The three RFID tags with 19 mm circle antennas were prepared and mounted to microscope slides and tested in a microwave oven as above described. The test of the set of RFID tags with 19 mm circle antennas was halted after approximately 10 seconds because all three antennas in the set immediately arced and burned when the microwave oven power came on, and the silicon integrated circuit was observed to be expelled (blown off) from the inlay. The damage caused by the microwave electromagnetic field to the RFID tags with 19 mm circle antennas is shown in FIG. 2.

The area of a polygon representing the outer shape of the 19 mm diameter circle inlays, the value of the wavelength of the electromagnetic radiation to which the inlays were exposed, an area of a circle with diameter equal to one-twelfth of the wavelength of the electromagnetic radiation and the value of a dimension equal to one-sixth of the wavelength of the electromagnetic radiation are presented in the following table.

| Area of 19 mm Diameter Antennas (Polygon) | Wavelength of 2450 MHz Microwave Radiation | Area of Circle with Diameter equal to 1/12 of Wavelength | Value of Dimension equal to 1/6 of Wavelength |
|---|---|---|---|
| 283.5 mm² | 122 mm | 80.11 mm² | 20.3 mm |

Comparative Example 3

Six segments of folded dipole antennas without silicon integrated circuits were trimmed from the elliptical loop antennas of RSI-128 inlays available from RSI ID Technologies, Chula Vista, Calif.

The six segments of folded dipole antennas without silicon integrated circuits were prepared and mounted to microscope slides and tested in a microwave oven as above described. The test of the set of folded dipole antennas was halted after approximately 20 seconds because the antennas at the outer ends of the microscope slide sample holder arced and burned significantly. The folded dipole antennas near the center of the microscope slide holder may have been shielded to some extent by the more outward located dipole antennas in the microscope slide holder and did not show damage from arcing or burning. The damage caused by the microwave electromagnetic field to the folded dipole antennas is shown in FIG. 1.

The area of a polygon representing the outer shape of the folded dipole antenna segments, the value of the wavelength of the electromagnetic radiation to which the inlays were exposed, an area of a circle with diameter equal to one-twelfth of the wavelength of the electromagnetic radiation and the value of a dimension equal to one-sixth of the wavelength of the electromagnetic radiation are presented in the following table.

| Area of Folded Dipole Antennas (Polygon) | Wavelength of 2450 MHz Microwave Radiation | Area of Circle with Diameter equal to 1/12 of Wavelength | Value of Dimension equal to 1/6 of Wavelength |
|---|---|---|---|
| 216 mm² | 122 mm | 80.11 mm² | 20.3 mm |

The length of the dipole segment if fully extended would be 89.5 mm.

Comparative Example 4

A 13.56 MHz RFID Tag-It™ HF-1 inlay having a multiple loop coil antenna and an ISO 15693 integrated circuit, with outer dimensions of 45 mm by 45 mm, available from Texas Instruments, Dallas, Tex., were placed individually upon the microwave turn table and tested as above described. Within 3 second of exposure, multiple sparks and arcing to the antenna were observed and the polyester film substrate of the antenna was burning. A second experiment was performed with the same type of inlay except that a small section of antenna was removed from it (so that the coil was not complete), and a third experiment was performed with the same type of inlay except the integrated circuit was removed. Both of these modified inlays also began burning within 3 seconds of microwave oven radiation.

The area of a polygon representing the outer shape of the 45 mm by 45 mm inlay, the value of the wavelength of the electromagnetic radiation to which the inlays were exposed, an area of a circle with diameter equal to one-eighth of the wavelength of the electromagnetic radiation and the value of a dimension equal to one-quarter of the wavelength of the electromagnetic radiation are presented in the following table.

| Area of 45 mm by 45 mm Antennas (Polygon) | Wavelength of 2450 MHz Microwave Radiation | Area of Circle with Diameter equal to 1/8 of Wavelength | Value of Dimension equal to 1/4 of Wavelength |
|---|---|---|---|
| 2,025 mm² | 122 mm | 182.65 mm² | 30.5 mm |

The tests and test results described above are intended solely to be illustrative, rather than predictive, and variations in the testing procedure can be expected to yield different results.

The present invention has now been described with reference to several embodiments thereof. The foregoing detailed description and examples have been given for clarity of understanding only. No unnecessary limitations are to be understood therefrom. All patents and patent applications cited herein are hereby incorporated by reference. It will be apparent to those skilled in the art that many changes can be made in the embodiments described without departing from the scope of the invention. Thus, the scope of the present invention should not be limited to the exact details and structures described herein, but rather by the structures described by the language of the claims, and the equivalents of those structures.

What is claimed is:

1. A microwaveable radio frequency identification tag, comprising:
   a substrate including a first major surface and a second major surface opposite the first major surface;
   a first radio frequency identification antenna on the first major surface of the substrate;
   wherein the first radio frequency identification antenna fits within a shape of a polygon that has an area which is less than approximately the area of a circle with a diameter of one-twelfth (0.083) the wavelength of electromagnetic radiation generated by a microwave source, and wherein any linear dimensions of the polygon are less than approximately one-sixth (0.167) of the wavelength of the electromagnetic radiation generated by the microwave source.

2. The microwaveable radio frequency identification tag of claim 1 further including an integrated circuit electrically connected to the first antenna.

3. The microwaveable radio frequency identification tag of claim 1 further comprising a second radio frequency identification antenna on the second major surface of the substrate, wherein the second antenna also fits within the shape of the polygon.

4. The microwaveable radio frequency identification tag of claim 1, wherein after being exposed to electromagnetic radiation generated by a microwave source, the radio frequency identification tag is able to be interrogated by an RFID interrogator.

5. The microwaveable radio frequency identification tag of claim 4, wherein the read range of the radio frequency identification tag by an RFID interrogator is at least 2 mm.

6. The microwaveable radio frequency identification tag of claim 1, wherein the polygon is a circle, and wherein the first antenna fits within the area of a circle with a diameter of one-twelfth (0.083) the wavelength of the energy of a microwave oven.

7. The microwaveable radio frequency identification tag of claim 1, further comprising a layer of adhesive attached to the substrate.

8. The microwaveable radio frequency identification tag of claim 1, further comprising a cover layer attached to the substrate, and a layer of adhesive between the cover layer and substrate.

9. The microwaveable radio frequency identification tag of claim 1, wherein the substrate comprises a flexible substrate.

10. The microwaveable radio frequency identification tag of claim 1, wherein the first antenna is a dipole antenna, and the length of the dipole antenna is less than approximately one-quarter (0.25) of the wavelength of the electromagnetic radiation generated by the microwave source.

11. The microwaveable radio frequency identification tag of claim 1, wherein the polygon is a circle with a diameter approximately 10 mm, and the frequency of the electromagnetic radiation generated by the microwave source is 2.45 GHz.

12. The microwaveable radio frequency identification tag of claim 1, wherein the first antenna fits within a shape of a polygon that has an area which is less than or equal to the area of a circle with a diameter of one-twelfth (0.083) the wavelength of electromagnetic radiation generated by a microwave source, and wherein the linear dimensions of the polygon are less than or equal to one-sixth (0.167) of the wavelength of the electromagnetic radiation generated by the microwave source.

13. A microwaveable radio frequency identification tag, comprising:
 a substrate including a first major surface and a second major surface opposite the first major surface;
 a first radio frequency identification antenna attached to the first major surface of the substrate;
 a low radio frequency-impedance element attached to the radio frequency identification antenna;
 wherein the first radio frequency identification antenna fits within a shape of a polygon that has an area which is less than approximately the area of a circle with a diameter of one-eighth (0.125) the wavelength of electromagnetic radiation generated by a microwave source, and wherein any linear dimensions of the first radio frequency identification antenna are less than approximately one-quarter (0.25) of the wavelength of the electromagnetic radiation generated by the microwave source.

14. The microwaveable radio frequency identification tag of claim 13 further including an integrated circuit electrically connected to the first antenna.

15. A microwaveable radio frequency identification tag of claim 13, wherein the low radio frequency-impedance element includes a capacitor.

16. A microwaveable radio frequency identification tag of claim 13, wherein the low radio frequency-impedance element comprises high DC resistance material.

17. The microwaveable radio frequency identification tag of claim 13 further comprising a second radio frequency identification antenna on the second major surface of the substrate, wherein the second antenna also fits within the shape of the polygon.

18. The microwaveable radio frequency identification tag of claim 13, wherein after being exposed to electromagnetic radiation generated by a microwave source, the radio frequency identification tag is able to be interrogated by an RFID interrogator.

19. The microwaveable radio frequency identification tag of claim 18, wherein the read range of the radio frequency identification tag by an RFID interrogator is at least 2 mm.

20. The microwaveable radio frequency identification tag of claim 13, wherein the polygon is a circle, and wherein the first antenna fits within the area of a circle with a diameter of one-eighth (0.125) the wavelength of the energy of a microwave oven.

21. The microwaveable radio frequency identification tag of claim 13, further comprising a layer of adhesive attached to the substrate.

22. The microwaveable radio frequency identification tag of claim 13, further comprising a cover layer attached to the substrate, and a layer of adhesive between the cover layer and substrate.

23. The microwaveable radio frequency identification tag of claim 13, wherein the substrate comprises a flexible substrate.

24. The microwaveable radio frequency identification tag of claim 13, wherein the first antenna is a dipole antenna, and the length of the dipole antenna is less than approximately one-quarter (0.25) of the wavelength of the electromagnetic radiation generated by the microwave source.

25. The microwaveable radio frequency identification tag of claim 13, wherein the polygon is a circle with a diameter approximately 10 mm, and the frequency of the electromagnetic radiation generated by the microwave source is 2.45 GHz.

26. The microwaveable radio frequency identification tag of claim 13, wherein the radio frequency identification antenna fits within a shape of a polygon that has an area which is less than or equal to the area of a circle with a diameter of one-twelfth (0.083) the wavelength of electromagnetic radiation generated by a microwave source, and wherein the linear dimensions of the polygon are less than or equal to one-sixth (0.167) of the wavelength of the electromagnetic radiation generated by the microwave source.

* * * * *

UNITED STATES PATENT AND TRADEMARK OFFICE
CERTIFICATE OF CORRECTION

PATENT NO.        : 7,535,366 B2                                          Page 1 of 1
APPLICATION NO.   : 11/610243
DATED             : May 19, 2009
INVENTOR(S)       : William C. Egbert It is certified that error appears in the above-identified patent and that said Letters Patent is hereby corrected as shown below:

Title Page, item 75 Inventors:

After "Katherine A. Brown, Lake Elmo, MN (US)," please insert --"Ronald D. Jesme, Plymouth, MN (US)."--

Signed and Sealed this
Twenty-ninth Day of November, 2011

David J. Kappos
*Director of the United States Patent and Trademark Office*